United States Patent
Chiang et al.

[11] Patent Number: 6,023,097
[45] Date of Patent: Feb. 8, 2000

[54] STACKED MULTIPLE-CHIP MODULE MICRO BALL GRID ARRAY PACKAGING

[75] Inventors: Kuo-Ning Chiang, Tao-Yen; Wen-Hwa Chen, Hsin-Chu; Kuo-Tai Tseng, Kao-Hsiang, all of Taiwan

[73] Assignee: ChipMOS Technologies, Inc., Hsin-Chu, Taiwan

[21] Appl. No.: 09/271,214

[22] Filed: Mar. 17, 1999

[51] Int. Cl.[7] .................................................. H01L 23/12
[52] U.S. Cl. .......................... 257/700; 257/704; 257/668; 257/698; 257/791; 257/773; 365/51
[58] Field of Search .................................... 257/700, 704, 257/668, 698, 791, 773, 778, 780, 738

[56] References Cited

U.S. PATENT DOCUMENTS

| | | | |
|---|---|---|---|
| 5,450,283 | 9/1995 | Lin et al. | 361/704 |
| 5,477,082 | 12/1995 | Buckley, III | 257/679 |
| 5,483,100 | 1/1996 | Marrs et al. | 257/700 |
| 5,485,038 | 1/1996 | Licari et al. | 257/758 |
| 5,488,542 | 1/1996 | Ito | 361/793 |
| 5,600,541 | 2/1997 | Bone et al. | 361/707 |
| 5,637,920 | 6/1997 | Loo | 257/700 |
| 5,668,405 | 9/1997 | Yamashita | 257/668 |
| 5,783,870 | 7/1998 | Mostafazadeh | 251/791 |
| 5,798,563 | 8/1998 | Feilchenfeld | 257/668 |
| 5,811,879 | 9/1998 | Akram | 257/698 |
| 5,841,191 | 11/1998 | Chia et al. | 257/691 |
| 5,870,289 | 2/1999 | Tokuda et al. | 361/779 |

*Primary Examiner*—Viet Q. Nguyen

[57] ABSTRACT

A micro ball grid array package is devised for a multiple-chip module (MCM). The IC chips in the package are stacked to save space. The bonding pads for the lower IC chip or chips are placed along the edges where the pads are not masked by the stacking of the upper chip or chips. When there are more than one chip at each level of the stacking, the IC chips at each level are butted with each other to further save space. The bonding pads of the chips are wire-bonded to a printed wiring plate, which has via holes through the printed wiring plate for connection to the ball grid array at the other side of the printed wiring plate and for surface mounting to a printed circuit board. A heat dissipating plate may be inserted at the bottom of the IC chips away from the stacking surface.

8 Claims, 5 Drawing Sheets

STACKED MULTIPLE-CHIP MODULE MICRO BALL GRID ARRAY PACKAGING

INTRODUCTION

This invention relates to integrated circuit packaging—in particular to multiple-chip module packaging.

As memory capacity of an integrated circuit chip increases from 4M, 16M, 64M, 128M to 256M, the manufacturing difficulty also increases and the manufacturing yield decreases. Another approach in increasing the memory capacity is to increase the packaging technique. For instance, a 128M memory can be obtained by packaging two 64M chips in one package, known as Multiple-chip Module (MCM). In this manner, the yield can be increased and the manufacturing difficulty can be reduced.

As integrated circuit functionality, performance and density continue to increase innovative next generation packaging approaches are in great demand. A popular packaging technique is the mirco Ball Grid Array ($\mu$BGA), where the bonding pads of an IC are fed through an insulating substrate via plated through holes to an array of soldering balls for bonding to a printed circuit board. While the $\mu$BGA package has been used for single chip IC, such an approach has not been used for MCM packages.

FIG. 1A shows a conventional single chip using a $\mu$BGA package. An IC chip 10 having bonding pads 12 along the edges connected to a printed wiring plate 14 (printed wiring not shown) with bonding wires 16. The printed wiring plate 14 has vias through which the terminals of the IC are fed to the ball grid array 18 serving as extensions for the IC terminals as shown in FIG. 1C. The IC chip 10 and the printed wiring plate are separated by a resin which serves a cushion to reduce any stress due to difference in thermal expansion of the IC chip 10 and the plated wiring plate 14 and to increase the reliability of the package.

The bonding pad arrangement shown in FIGS. 1A, 1B and 1C is not economical for a MCM, because space must be allowed between adjacent IC chips to run interconnections for the chips. When space is allowed between adjacent IC chips, the overall package size of an MCM is increased, as is the cost.

SUMMARY

An object of this invention is to minimize the package size of a $\mu$BGA MCM package. Another object of this invention is to increase the yield of producing MCM. Still another object of the present invention is to increase the heat dissipation of a MCM. A further object of this invention is to reduce moisture absorption of a MCM package.

These objects are achieved by stacking and butting the IC chips of a MCM and rearranging the design of the bonding pads in the IC chips. The adjacent IC chips can share a common printed wiring plate, through which the terminals of the IC chips are fed to an array of soldering ball grids for surface mounting on a printed circuit board.

DETAILED DESCRIPTION OF THE PREFERRED EMBODIMENT

Figure 2A:
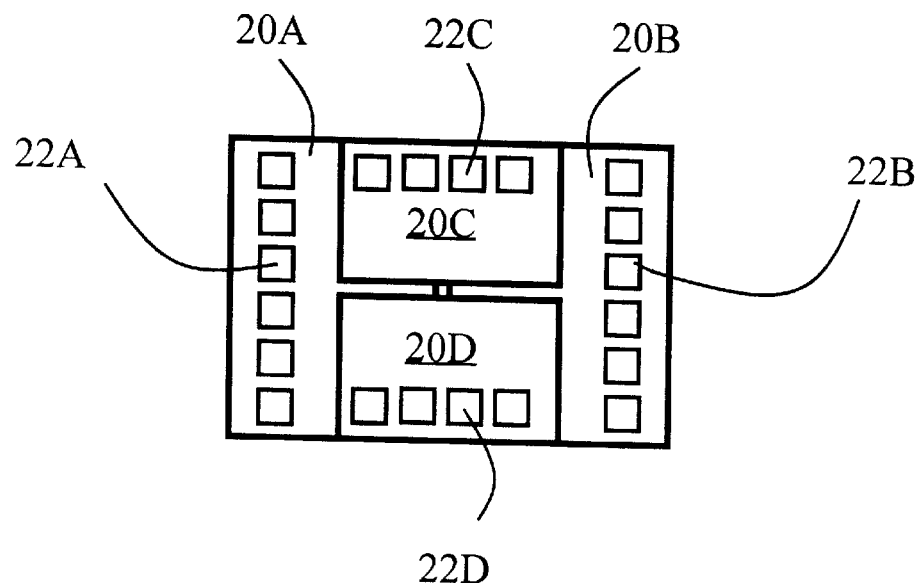
FIG. 2A shows the bonding pad arrangement of a four-chip MCM in a $\mu$BGA package.

FIG. 2A shows the bonding pad arrangement of a four IC chip MCM in a BGA package based on the present invention. The four IC chips are 20A, 20B, 20C and 20D. The IC chips 20C and 20D are butted against each other and stacked over the IC chips 20A and 20B, which are also butted against each other. The bonding pads 22A, 22B, 22C and 22D for the four IC chips are aligned along one side of the corresponding IC chips 20A, 20B, 20C and 20D respectively. In so arranged, no space is needed between the butting IC chips, i.e. between chips 20A and 20B, and between chips 20C and 20D, because no space is needed to run interconnections where there is no bonding pad nearby.

Figure 2B:
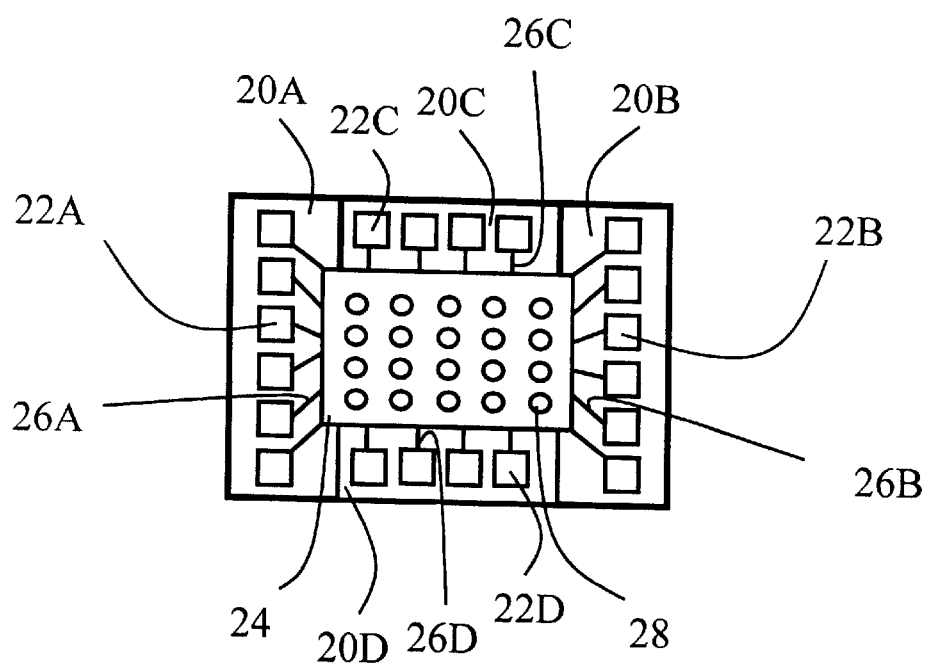
FIG. 2B shows the structure of FIG. 2A covered with a feed-through printed wiring plate.

FIG. 2B shows a printed wiring plate 24 covering the stacked IC chips shown in FIG. 2A. The printed wiring plate is wire bonded to the bonding pads of the IC chips 20A, 20B, 20C and 20D through the bonding wires such as 26A, 26B, 26C and 26C, respectively.

Figure 1A:
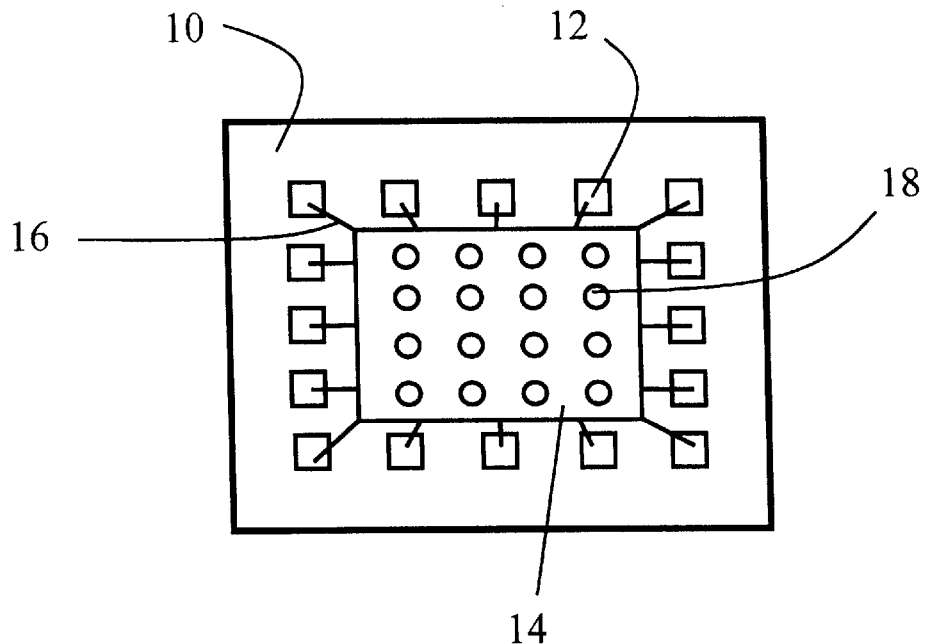
FIG. 1A shows the bonding pads of an IC chip for a conventional $\mu$BGA package.
Figure 1B:
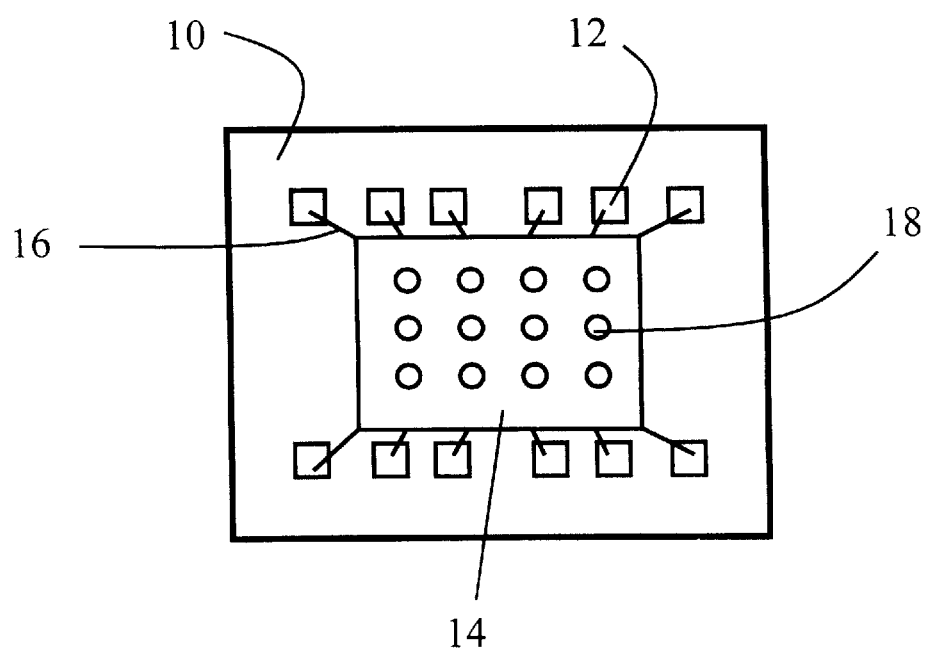
FIG. 1B shows another arrangement of bonding pads of IC chip for a conventional $\mu$BGA package.
Figure 1C:
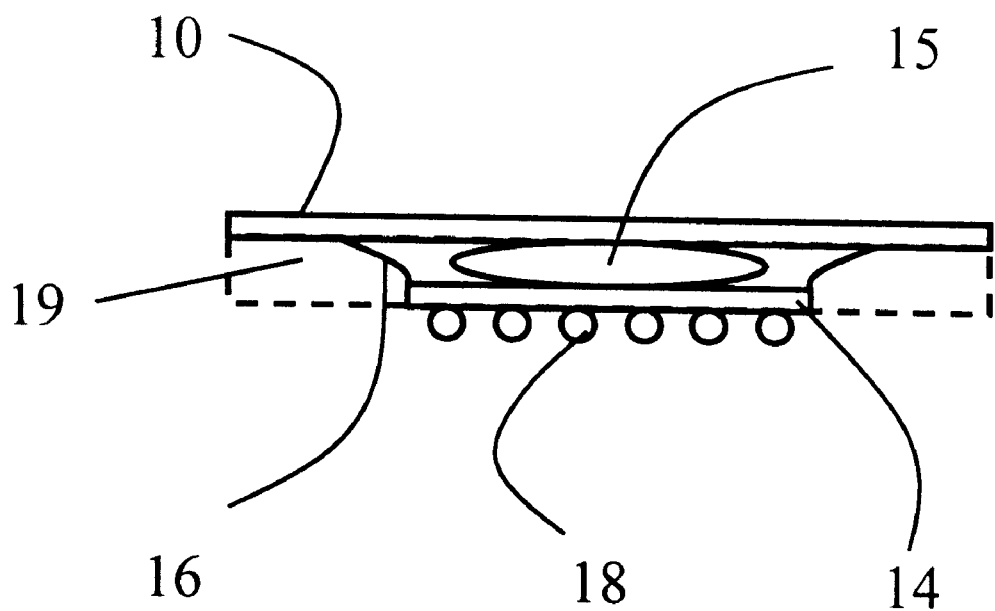
FIG. 1C shows a side view of the $\mu$BGA package shown in FIGS. 1A, 1B.
Figure 2C:
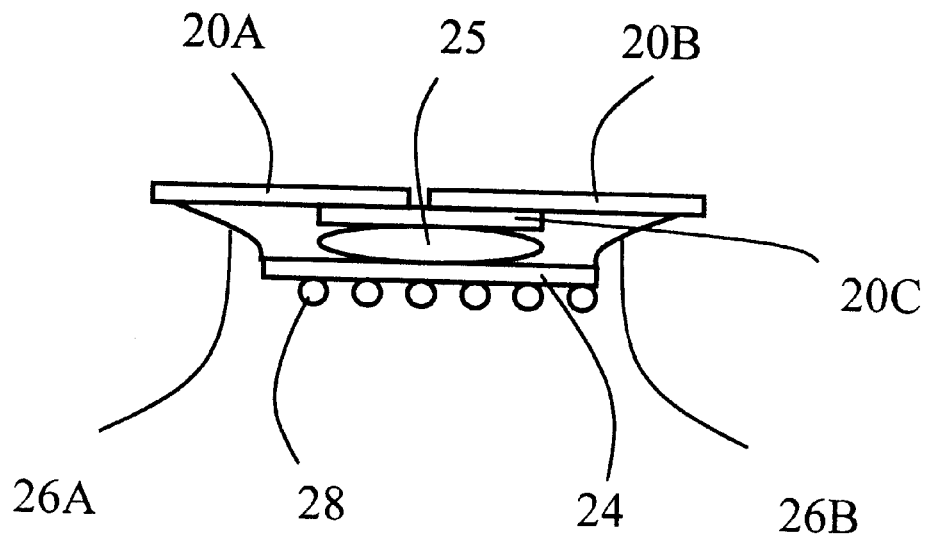
FIG. 2C shows the side view of the structure shown in FIG. 2B.

FIG. 2C shows the side view of the structure. The printed wiring plate has through holes for connection to the other side of a ball grid array 28. The IC chips such as 20C are separated from the plated wiring plate 24 by a resin cushion 25 to reduce thermal and mechanical stress similar to the cushion 15 shown in FIG. 1C.

Figure 2D:
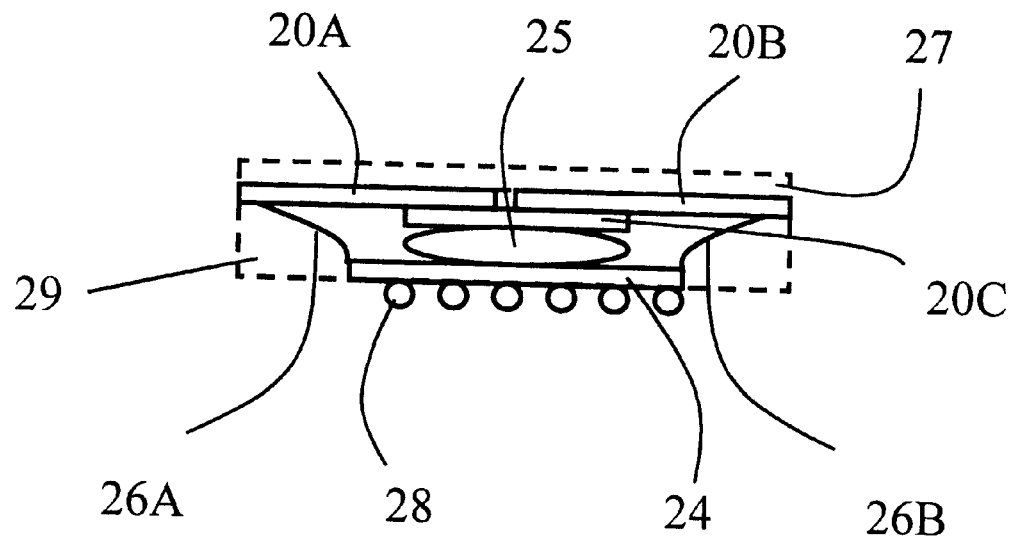
FIG. 2D shows the structure shown in FIG. 2C sealed in resin.

FIG. 2D shows the structure shown in FIG. 2C is inserted with a heat dissipating plate 27, which can be metal or non-metal. The entire structure is sealed in glue 29 to protect the MCM against shock and moisture.

Figure 3:
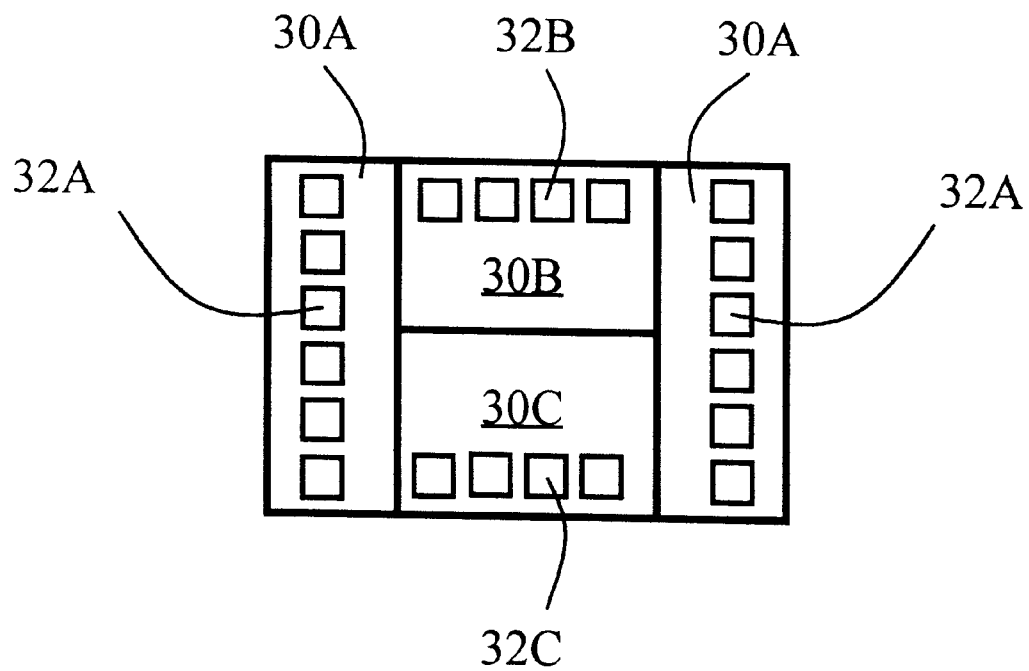
FIG. 3 shows the bonding pad arrangement of a stacked three-chip MCM in a $\mu$BGA package.

FIG. 3 shows another embodiment of the present invention for a three-chip MCM. The first chip 32A occupies a larger area than two smaller IC chips 30B and 30C which lay over the chip 32A. The two smaller chips are butted against each other. As in FIG. 2A, the bonding pads of chips 32B and 32C are placed along one side the respective chips. However, the bonding pads of the larger chip 32 are placed along two opposite sides not covered by the IC chips 30B and 30C. Thus, all the bonding pads lie along the overall edges of the stacked structure, which can then be fed to a $\mu$BGA through a printed wiring plate such as that shown in FIG. 2C.

Figure 4:
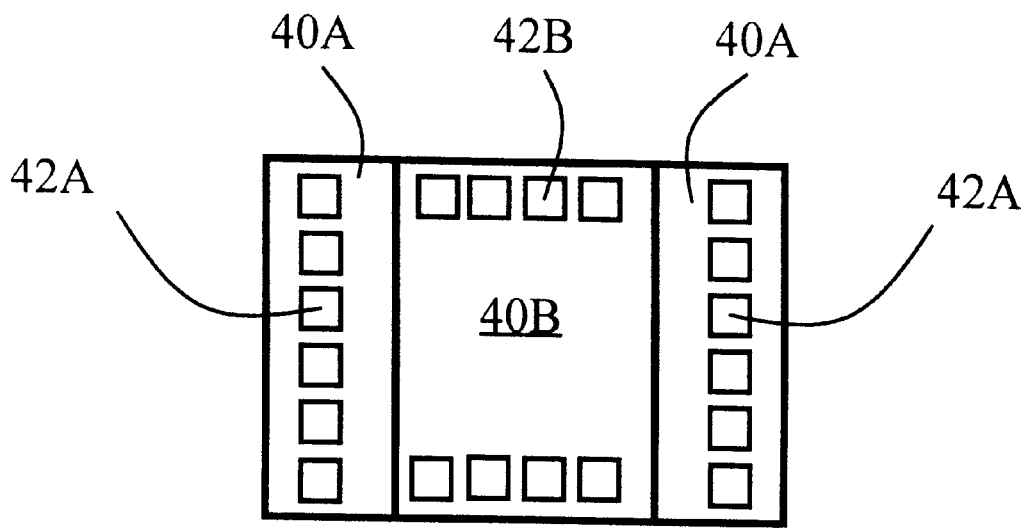
FIG. 4 shows the bonding pad arrangement of a stacked two-chip MCM in a $\mu$BGA package.

FIG. 4 shows another embodiment of the present invention for a two-chip MCM in a $\mu$BGA A package. In this embodiment, an IC chip 40A is larger than a stacked IC chip 40B. The bonding pads 42A of the larger chip 40A are placed vertically at two opposite ends not covered by the smaller IC chip 40B. The bonding pads 42B of the smaller IC chip 40B are placed horizontally along two opposite ends of the IC chip 40B. Thus all the bonding pads of the overall structure are located at the four edges of the overall stacked structure.

While all the embodiments described use lead bond for connecting the IC chips to the common substrate, it should be obvious that the connection can also be implemented with flip-chip or wire-bonding technique.

While the preferred embodiments have been shown and described, it will be apparent to those skilled in the art that various modifications may be made in the embodiments without departing from the spirit of the present invention. Such modifications are all within the scope of this invention.

What is claimed is:

1. A ball grid array (BGA) package for a multiple chip module (MCM), comprising:
    at least two integrated circuit (IC) chips stacking over one and another;
    bonding pads for said placed along edges of said IC chips not covered by said stacking; and
    a printed wiring plate having a first side connected to said bonding pads and having through holes connected to a second side with said BGA.

2. A BGA package as described in claim 1, wherein there are four said IC chips, with two smaller IC chips of said four IC chips butting against each other and stacking over two larger butted IC chips of said four IC chips.

3. A BGA package as described in claim 1, wherein there are three said IC chips, with two smaller IC chips of said three IC chips butting against each other and stacking over a larger IC chip of said three IC chips.

4. A BGA package as described in claim 1, wherein there are two said IC chips with the smaller of said two IC chips stacking over the larger of said two IC chips.

5. A BGA package as described in claim 1, wherein said the IC chips are separated from said printed wiring plate by a cushion.

6. A BGA package as described in claim 5, wherein said cushion is a resin.

7. A BGA package as described in claim 5, wherein said package is sealed in a glue.

8. A BGA package as described in claim 1, further comprising a heat dissipating plate contacting the surface of said IC chips away from the interface where said IC chips are stacked and from the plated wiring plate.

* * * * *